(12) United States Patent
Chidambarrao

(10) Patent No.: US 8,053,844 B2
(45) Date of Patent: Nov. 8, 2011

(54) HYBRID ORIENTATION SCHEME FOR STANDARD ORTHOGONAL CIRCUITS

(75) Inventor: Dureseti Chidambarrao, Weston, CT (US)

(73) Assignee: International Business Machines Corporation, Armonk, NY (US)

( * ) Notice: Subject to any disclaimer, the term of this patent is extended or adjusted under 35 U.S.C. 154(b) by 192 days.

(21) Appl. No.: 12/431,094

(22) Filed: Apr. 28, 2009

(65) Prior Publication Data

US 2009/0206412 A1   Aug. 20, 2009

Related U.S. Application Data

(63) Continuation of application No. 11/308,085, filed on Mar. 6, 2006, now Pat. No. 7,573,104.

(51) Int. Cl.
H01L 29/04 (2006.01)
H01L 21/77 (2006.01)
H01L 21/8238 (2006.01)

(52) U.S. Cl. ......... 257/371; 257/E27.067; 257/E29.004; 257/E21.598; 257/E21.632; 438/198; 438/455

(58) Field of Classification Search .............. 257/369, 257/371, E27.062, E27.067, E29.004, E27.063, 257/E27.064, E27.065, E27.066, E21.532, 257/E21.536, E21.598, E21.599, E21.632, 257/E21.705; 438/147, 150, 168, 187, 198, 438/199, 275, 286, 455, 458, 459
See application file for complete search history.

(56) References Cited

U.S. PATENT DOCUMENTS

| | | | | |
|---|---|---|---|---|
| 5,729,045 A | * | 3/1998 | Buynoski | 257/627 |
| 7,160,769 B2 | * | 1/2007 | White et al. | 438/198 |
| 2005/0001290 A1 | | 1/2005 | Chan et al. | |
| 2005/0083445 A1 | | 4/2005 | Kang et al. | |
| 2005/0280121 A1 | | 12/2005 | Doris et al. | |
| 2008/0064160 A1 | * | 3/2008 | Kim et al. | 438/233 |

OTHER PUBLICATIONS

Yang, et al., "High Performance CMOS Fabricated on Hybrid Substrate with Different Crystal Orientations," IEEE, 2003, pp. 18.7.1-18.7.4.
Chidambarrao, D., U.S. Appl. No. 11/308,085, Office Action Communication, Aug. 6, 2008, 5 pages.
Chidambarrao, D., U.S. Appl. No. 11/308,085, Office Action Communication, Oct. 20, 2008, 12 pages.
Chidambarrao, D., U.S. Appl. No. 11/308,085, Notice of Allowance Communication, Apr. 3, 2009, 5 pages.
International Search Report, Feb. 13, 2008.

* cited by examiner

*Primary Examiner* — Samuel Gebremariam
*Assistant Examiner* — Andrew O Arena
(74) *Attorney, Agent, or Firm* — Gibb I.P. Law Firm, LLC

(57) ABSTRACT

Embodiments herein present device, method, etc. for a hybrid orientation scheme for standard orthogonal circuits. An integrated circuit of embodiments of the invention comprises a hybrid orientation substrate, comprising first areas having a first crystalline orientation and second areas having a second crystalline orientation. The first crystalline orientation of the first areas is not parallel or perpendicular to the second crystalline orientation of the second areas. The integrated circuit further comprises first type devices on the first areas and second type devices on the second areas, wherein the first type devices are parallel or perpendicular to the second type devices. Specifically, the first type devices comprise p-type field effect transistors (PFETs) and the second type devices comprise n-type field effect transistors (NFETs).

20 Claims, 7 Drawing Sheets

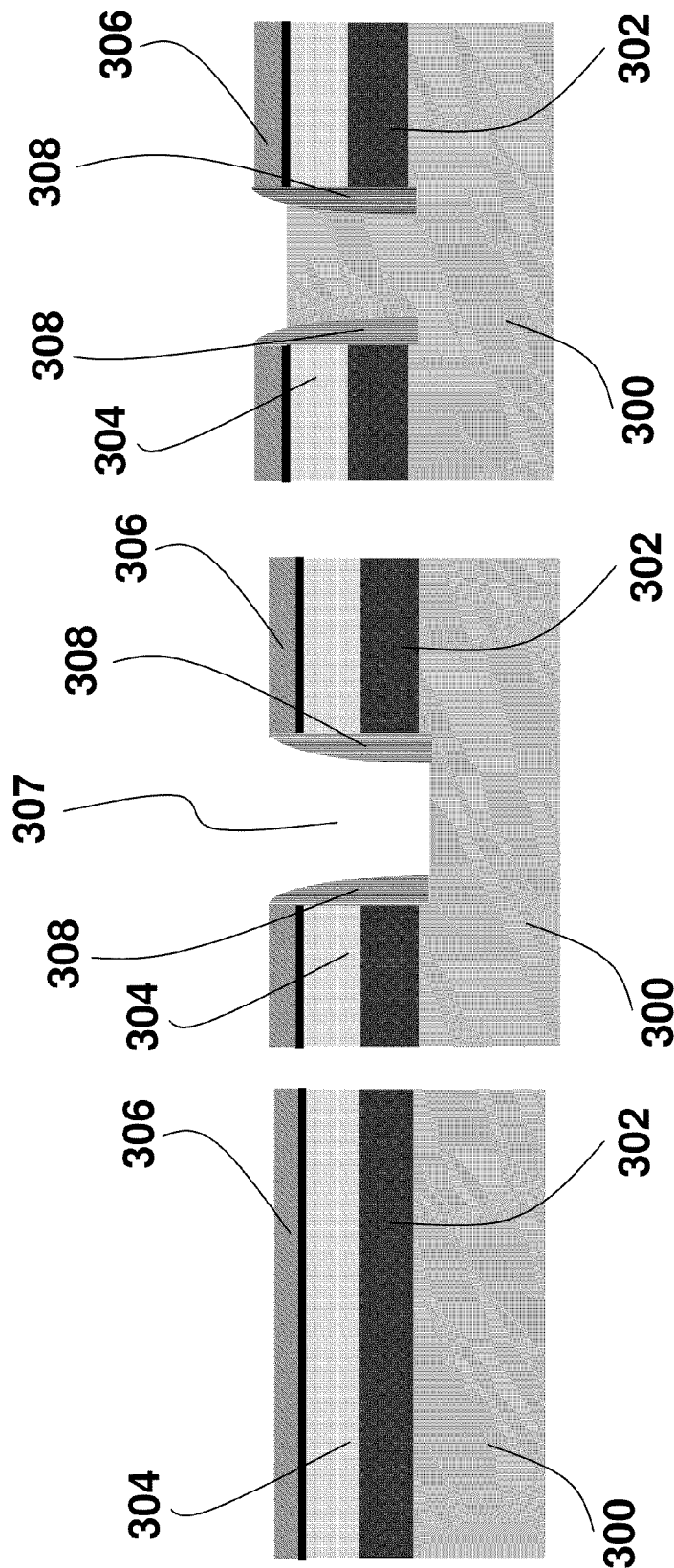

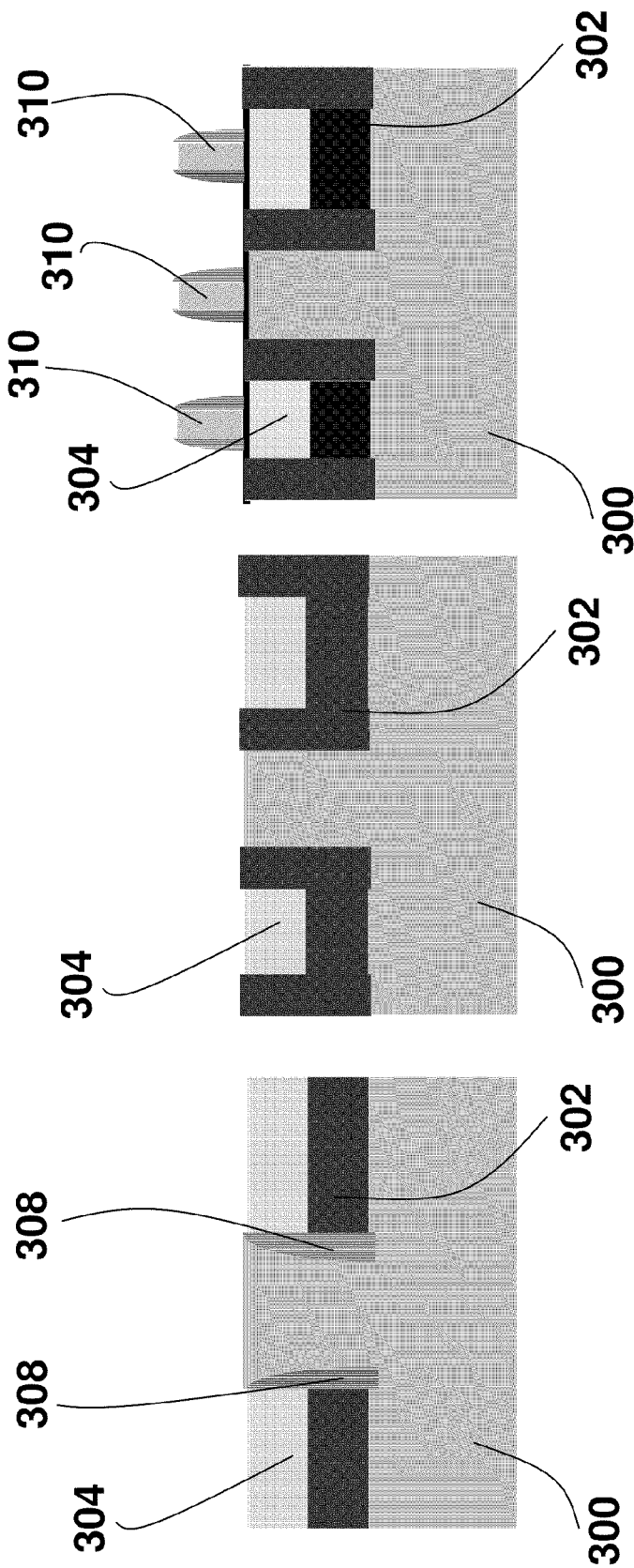

(100) surface (110) surface

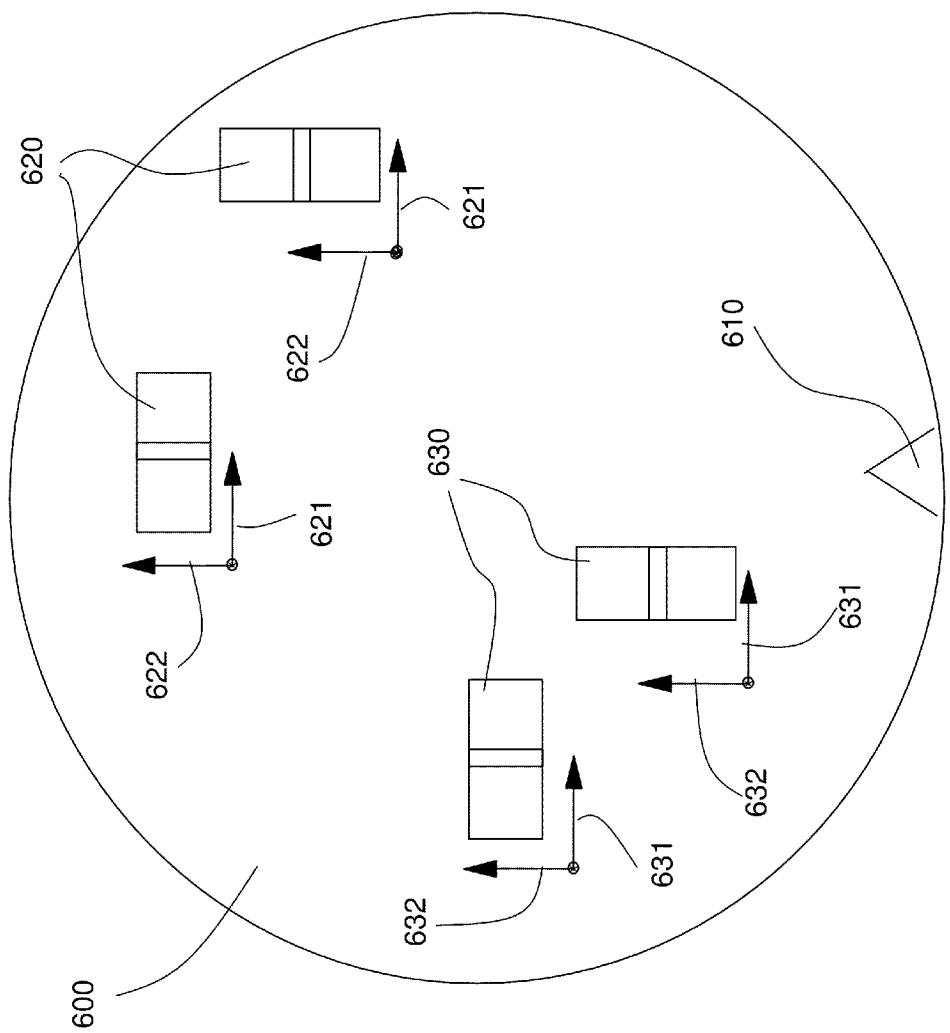

HYBRID ORIENTATION SCHEME FOR STANDARD ORTHOGONAL CIRCUITS

CROSS REFERENCE TO RELATED APPLICATIONS

This application is a Continuation of U.S. application Ser. No. 11/308,085 filed Mar. 6, 2006, the complete disclosure of which, in its entirety, is herein incorporated by reference.

BACKGROUND OF THE INVENTION

1. Field of the Invention

Embodiments herein present a device, method, etc. for a hybrid orientation scheme for standard orthogonal circuits.

2. Description of the Related Art

It is known that hole mobility is more than doubled on (110) silicon substrates with current flow direction along <110> compared with conventional (100) substrates. However electron mobility is the highest on (100) substrates. To fully utilize the advantage of the carrier mobility dependence on surface orientation, CMOS devices have been fabricated on hybrid substrates with different crystal orientations, with NFETs on silicon of (100) surface orientation and PFETs on (110) surface orientation with the NFET and PFET current flows both chosen to be in <110> directions. High performance CMOS devices using 90 nm technology with physical gate oxide thickness as thin as 1.2 nm have been demonstrated. Significant PFET enhancement has been achieved.

SUMMARY OF THE INVENTION

Embodiments herein present device, method, etc. for a hybrid orientation scheme for standard orthogonal circuits. An integrated circuit of embodiments of the invention comprises a hybrid orientation substrate, comprising first areas having a first crystalline orientation and second areas having a second crystalline orientation. The first crystal orientation is (110) surface with the polysilicon gates aligned such that their source-drain directions are either (−11 sqrt(2)) or (1-1 sqrt(2)) directions. Here the two gate orientations are orthogonal to each other and have identical current flow directions. The second crystal orientation is (001) surface with (110) and (1-10) polysilicon gate orientations. The first crystalline orientation of the first areas is not parallel or perpendicular to the second crystalline orientation of the second areas. The integrated circuit further comprises first type devices on the first areas and second type devices on the second areas (each comprising the polysilicon gates), wherein the first type devices are parallel or perpendicular to the second type devices. Specifically, the first type devices comprise p-type field effect transistors (PFETs) and the second type devices comprise n-type field effect transistors (NFETs).

Within the first area, the orthogonal gates are built such that the first type devices comprise a first direction current flow and a second direction current flow, wherein the first current flow is orthogonal to the second current flow. A first carrier mobility of the first current flow is equal to a second carrier mobility of the second current flow. The second area orthogonal gates are built such that the second type devices also comprise a first direction current flow and a second direction current flow which have carrier mobilities that are equal.

Embodiments herein further comprise a method of forming an integrated circuit, wherein the method attaches a first wafer having a first crystal orientation to a second wafer having a second crystal orientation such that the first crystal orientation is not parallel or perpendicular to the second crystal orientation. Next, the method etches openings within the first wafer and grows the second wafer through the openings to create second wafer regions within the first wafer. The method then forms first type devices on the first wafer regions and second type devices on the second wafer regions. Specifically, formation of the first and second type devices comprises forming PFETs and NFETs.

Moreover, the second type devices are formed parallel or perpendicular to the first type devices. When attaching the first wafer, the first wafer is attached to the second wafer at an angle such that the first type devices comprise a first current flow and a second current flow, wherein the first current flow is orthogonal to the second current flow. In addition, the method forms the first type devices with first and second current flows having a first carrier mobility and a second carrier mobility, respectively, wherein the first carrier mobility is equal to the second carrier mobility. Further, the method forms the second type devices again with first and second current flows having identical carrier mobilities.

Accordingly, the two in-plane orthogonal directions have the same mobility. They are in the (11 sqrt(2) and (11-sqrt(2))) directions. While there is no direct measurement of the mobility of the current flows in the (11 sqrt(2)) directions, it is reasonable to suggest that the hole mobility value would lie between those of the <110> (100) and <110> (110) directions. Therefore, instead of the highly skewed 157% and 70% benefit for the two orthogonal directions of the prior art, embodiments herein get approximately 110% benefit in both directions. This gives a major structural opportunity to integrate orthogonally designed circuits.

These, and other, aspects and objects of the present invention will be better appreciated and understood when considered in conjunction with the following description and the accompanying drawings. It should be understood, however, that the following description, while indicating embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF THE DRAWINGS

The invention will be better understood from the following detailed description with reference to the drawings, in which:

FIGS. 3A, 3B, 3C, 4A, 4B, and 4C are diagrams illustrating method steps for forming semiconductor devices using hybrid orientation technology;

FIG. 6 is a diagram illustrating an integrated circuit; and

DETAILED DESCRIPTION OF PREFERRED EMBODIMENTS OF THE INVENTION

Figure 1B:
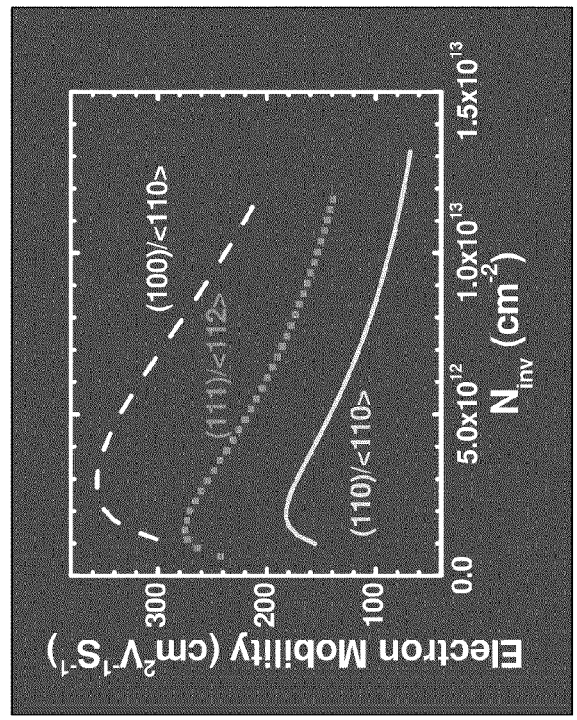
FIGS. 1A and 1B are graphs illustrating carrier mobility dependence on surface orientation.

The present invention and the various features and advantageous details thereof are explained more fully with reference to the nonlimiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention. The examples used herein are intended merely to facilitate an understanding of ways in which the invention may be practiced and to further enable those of skill in the art to practice the invention. Accordingly, the examples should not be construed as limiting the scope of the invention.

Embodiments of the invention present two in-plane orthogonal current flows having the same mobility. While there is no direct measurement of the mobility of the current flows, it is reasonable to suggest that the hole mobility value would lie between those of the <110> (100) and <110> (110) directions. Therefore, instead of the highly skewed 157% and 70% benefit for the two orthogonal directions of the prior art, embodiments herein get approximately 110% benefit in both directions. This gives a major structural opportunity to integrate orthogonally designed circuits. There is a major concern with the many process knobs that are needed to be optimized for integration. If the fall back is to go back to <001> surface devices for both NFET and PFET, then the ratio of the two orthogonal devices radically changes and circuit designs may fail.

Figure 1A:
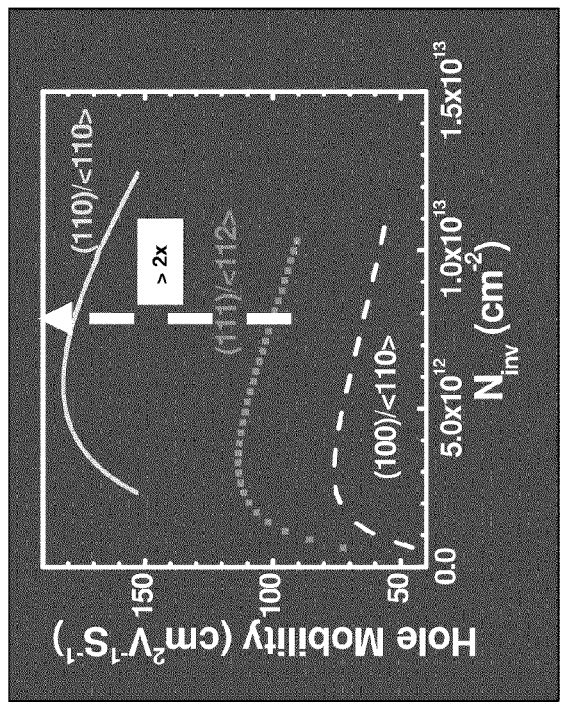

The hybrid orientation scheme has been proposed (Yang et al., IEDM 2002) to leverage the best hole and electron mobility advantages. The electron mobility is highest on the (100) wafer surface while the hole mobility is highest on the (110) surface as seen in FIGS. 1A-1B.

Figure 2B:
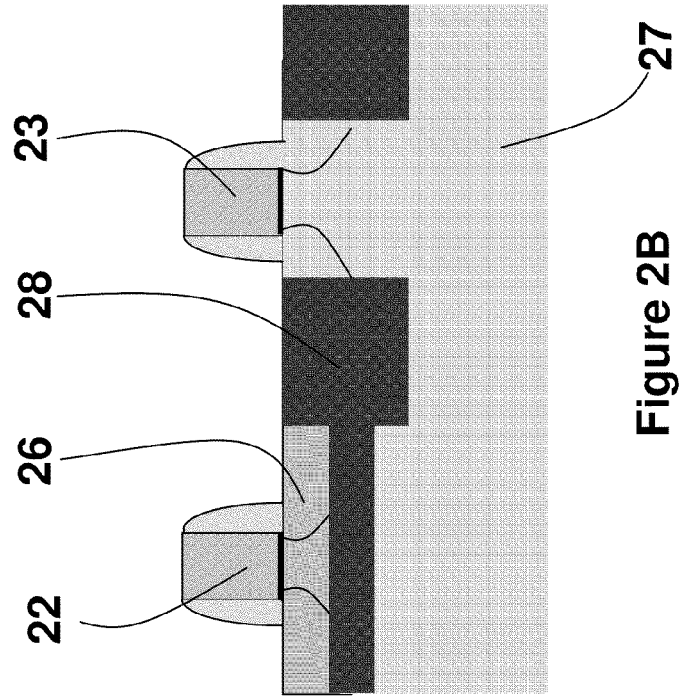
FIGS. 2A and 2B are diagrams illustrating semiconductor devices using hybrid orientation technology.
Figure 2A:
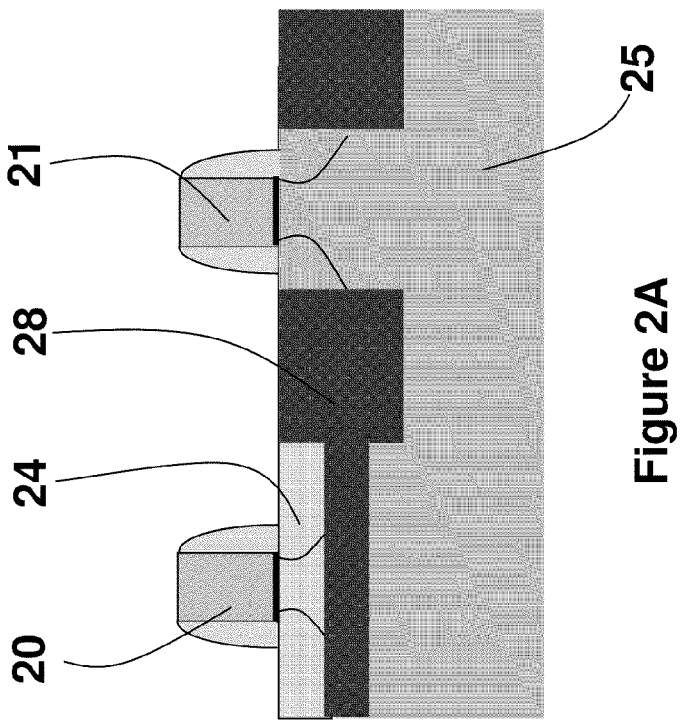

More specifically, the solid lines represent carrier mobility on the (110) wafer surface; the dotted lines represent carrier mobility on the (111) wafer surface; and, the dashed lines represent carrier mobility on the (100) wafer surface. Therefore, Yang came up with the structure in FIGS. 2A-2B where the n-type field effect transistor (NFET) is done on the (100) surface while the p-type field effect transistor (PFET) is done on the (110) surface and the process for this is seen in FIGS. 3 and 4. Specifically, FIG. 2A illustrates a PFET 20 on a (110) silicon-on-insulator 24 and an NFET 21 on a (100) silicon handle wafer 25, wherein STI members 28 are on an upper portion of the (100) silicon handle wafer 25. Moreover, FIG. 2B illustrates an NFET 22 on a (100) silicon-on-insulator 26 and a PFET 23 on a (110) silicon handle wafer 27, wherein STI members 28 are on an upper portion of the (110) silicon handle wafer 27.

| Key Process Step | Type A (FIG. 1A) | Type B (FIG. 2B) |
| --- | --- | --- |
| layer transfer @ bonding | in (110) Si | in (100) Si |
| Selective Epitaxy | grow (100) Si | grow (110) Si |

FIG. 3A illustrates thin oxide and nitride deposition, wherein a buried oxide layer (BOX) 302 is formed on a silicon handle wafer 300, a silicon-on-insulator 304 is formed on the BOX 302 and a nitride layer 306 is formed on the silicon-on-insulator 304. Next, middle portions of the nitride layer 306, the silicon-on-insulator 304, and the BOX 302 are removed to form a gap 307, wherein spacers 308 are formed in the gap 307 (FIG. 3B). The silicon handle wafer 300 is then epitaxially grown up through the gap 307 followed by chemical mechanical polishing (FIG. 3C). As illustrated in FIG. 4A, the nitride layer 306 is removed.

Next, standard shallow trench isolation is created between the silicon-on-insulator 304 and the epitaxially grown portion of the silicon handle wafer 300. The spacers 308 are also removed (FIG. 4B). Gate and spacer devices 310 are then formed over the silicon-on-insulator 304 and the epitaxially grown portion of the silicon handle wafer 300 (FIG. 4C).

Figure 5D:
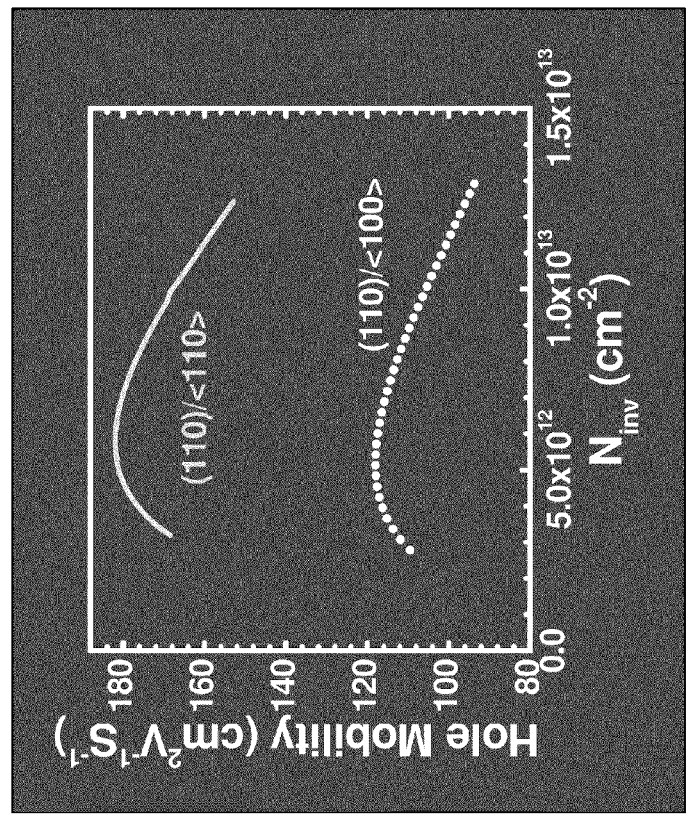
FIGS. 5A, 5B, 5C and 5D are diagrams illustrating surface and current flow directions of a semiconductor device using hybrid orientation technology.
Figure 5C:
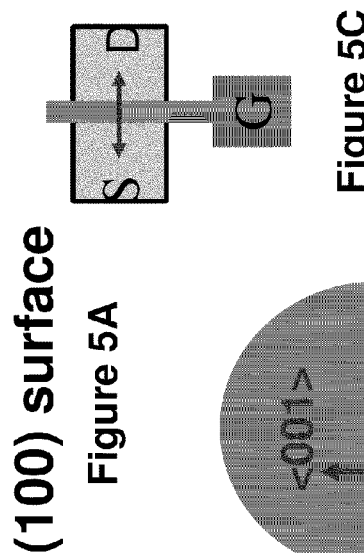
Figure 5A:
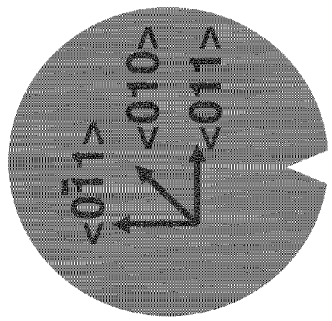
Figure 5B:
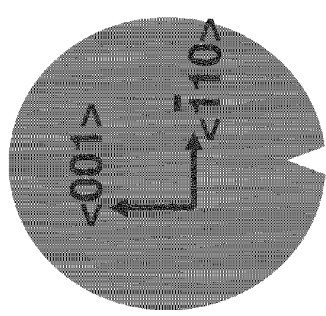

FIGS. 5A and 5B show orientations of the gate for the NFET (100) and PFET (110) surfaces. FIG. 5C illustrates a top view of the gate, source, and drain areas. On the (100) surface for the NFET the current flow is <110> direction. On the (110) surface the hole mobility is highest in the <110> direction (FIG. 5D). Yang proposes to align the gate in the (110) direction to get the maximum benefit. However, while it has the best mobility gains it causes complications in circuit design. This is because the PFET device orthogonal to the <110> direction would have a channel current flow <100> direction. This makes the two devices different. In SRAMs and other logic circuits this causes an additional layer of complexity in circuit design and limits the gate orientation.

Referring now to FIG. 6, embodiments of the invention comprise a hybrid orientation substrate 600 having a notch 610, PFETs 620, and NFETs 630. The substrate 600 can represent either a type A structure, wherein the PFETs 620 are on a (110) silicon-on-insulator (i.e., a (110) crystalline oriented surface) and the NFETs 630 are on a (100) silicon epitaxial layer (i.e., a (100) crystalline oriented surface); or a type B structure, wherein the NFETs 630 are on a (100) silicon-on-insulator and the PFETs 620 are on a (110) silicon epitaxial layer (see FIG. 2).

Each of the PFETs 620 and each of the NFETs 630 comprise a source, a drain, a channel, and a gate (not shown). Extensions can be optionally used. The source and the drain are heavily doped regions in the substrate 600, wherein majority carriers flow into the channel through the source and out through the drain. The channel is a high conductivity region connecting the source and the drain, wherein conductivity of the channel is controlled by the gate.

The PFETs 620 comprise current flows 621 and 622; and the NFETs 630 comprise current flows 631 and 632. Specifically, the current flow 621 is oriented in the <1-1 sqrt(2)> direction and the current flow 622 is oriented in the <−1 1 sqrt(2)> direction. The current flow 621 is orthogonal to the current flow 622.

The substrate 600 is formed by a layer transfer technique through wafer bonding. First hydrogen is implanted into an oxidized silicon substrate with (110) orientation for type A or (100) orientation for type B. Then the wafer is flip-bonded to a handle wafer with different surface orientation. A two-phase heat treatment is then carried out to split the hydrogen implanted wafer and strengthen the bonding. Finally the top SOI (silicon-on-insulator) layer is polished and thinned down to the desired thickness, for example, about 50 nm.

The process flow for CMOS fabrication on the hybrid substrate is shown in FIGS. 3 and 4. One additional lithography level is added to the standard CMOS processes, which is used to etch through the SOI and the buried-oxide layer and expose the surface of the handle wafer. The opened area should be for the NFETs 630 in the case of type A substrate or for the PFETs 620 for type B. Following a spacer formation, epitaxial silicon is selectively grown through the opening by rapid thermal chemical vapor deposition. As a nature of epitaxy, this epi-silicon will be in the same crystal orientation as the handle wafer. Defect-free silicon epitaxial layers from both (100) and (110) handle wafers have been achieved. A defective interface between the epitaxial silicon grown from the SOI layer and the handle wafer will occur in case of spacer loss, which can be eliminated by improved processes. To avoid potential problems from facets due to the selective epitaxy, the epitaxial silicon thickness is adjusted to the point where the entire surface of the epitaxy layer is completely above the top surface of the thin nitride. Excessive silicon is then polished down by chemical mechanical polishing (CMP) to the thin nitride and etched back to level with the SOI surface. The additional lithography level used for silicon epitaxy in the NFET (or PFET) area is a large block level (several times larger than the critical dimension), and is possible to be scaled beyond 45 nm technology node.

After removing the thin nitride and oxide, CMOS fabrication is continued (including both types of devices), including shallow trench isolation, well implants, gate oxide and polysilicon gate formations, spacer (oxide or nitride or multiple combinations thereof) formations, implants for junctions formations (halos, extension, source/drain, etc.) silicide formation (can be Ni, Co, Pt, NiPt, NiPtRe, Pd, Ti, and other two or 3 phase silicides) and metal contacts (W, Cu, etc.). Gate stacks are patterned for the PFET to have a first current flow in the <1-1 sqrt(2)> direction (i.e., the current flow 610) and a second current flow in the <−11 sqrt (2)> direction (i.e., the current flow 620).

Accordingly, embodiments herein present an integrated circuit comprising the hybrid orientation substrate 600, including first areas having a first crystalline orientation and second areas having a second crystalline orientation. The first crystalline orientation of the first areas is not parallel or perpendicular to the second crystalline orientation of the second areas. For example, as discussed above, the first areas are on a (110) silicon-on-insulator (type A) or on a (110) silicon epitaxial layer (type B). Further, the second areas are on a (100) silicon epitaxial layer (type A) or on a (100) silicon-on-insulator (type B). The above HOT combinations with dual SOI and Direct Silicon Bonding for bulk are encompassed in embodiments of the invention.

The integrated circuit further comprises first type devices on the first areas and second type devices on the second areas, wherein the first type devices are either parallel or perpendicular to the second type devices. More specifically, the first type devices comprise PFETs 620 and the second type devices comprise NFETs 630. As discussed above, each of the PFETs 620 and each of the NFETs 630 comprise a source, a drain, a channel, and a gate. The source and the drain are heavily doped regions in the substrate 600, wherein majority carriers flow into the channel through the source and out through the drain. The channel is a high conductivity region connecting the source and the drain, wherein conductivity of the channel is controlled by the gate.

Thus, embodiments herein leverage the best hole and electron mobility advantages. As discussed above, the electron mobility is highest on the <001> wafer surface while the hole mobility is highest on the <110> surface as seen in FIG. 1. Embodiments of the invention comprise the PFETS 620 on the <110> surface and the NFETS 630 on the <001> surface.

Additionally, the first type devices comprise a first current flow and a second current flow, wherein the first current flow is orthogonal to the second current flow, and wherein a first carrier mobility of the first current flow is equal to a second carrier mobility of the second current flow.

Embodiments herein further comprise a method of forming an integrated circuit, wherein the method attaches a first wafer having a first crystal orientation (e.g., (110) silicon-on-insulator) to a second wafer having a second crystal orientation (e.g., (100) silicon epitaxial layer) such that the first crystal orientation is not parallel or perpendicular to the second crystal orientation. As discussed above, a two-phase heat treatment is carried out to split the hydrogen implanted wafer (i.e., the first wafer) and strengthen the bonding. Due to the different activation energy, (110) wafer requires a higher splitting temperature. The top SOI (silicon-on-insulator) layer is polished and thinned down to the desired thickness, for example, about 50 nm.

Next, the method etches openings within the first wafer and grows the second wafer through the openings to create second wafer regions within the first wafer. As discussed above, to avoid potential problems from facets due to the selective epitaxy, the epitaxial silicon thickness is adjusted to the point where the entire surface of the epitaxy layer is completely above the top surface of the thin nitride. Excessive silicon is then polished down by chemical mechanical polishing (CMP) to the thin nitride and etched back to level with the SOI surface. The additional lithography level used for silicon epitaxy in the NFET (or PFET) area is a large block level (several times larger than the critical dimension), and is possible to be scaled beyond 45 nm technology node.

The method then forms first type devices on the first wafer and second type devices on the second wafer regions, wherein the second type devices are formed parallel or perpendicular to the first type devices. Specifically, formation of the first and second type devices comprises forming the PFETs 620 and the NFETs 630. As discussed above, each of the PFETs 620 and each of the NFETs 630 comprise a source, a drain, a channel and a gate.

Furthermore, when attaching the first wafer, the first wafer is attached to the second wafer at an angle such that the first type devices comprise a first current flow and a second current flow, wherein the first current flow is orthogonal to the second current flow. For example, the current flow 621 is formed oriented in the <1-1 sqrt(2)> direction and the current flow 622 is formed oriented in the <−11 sqrt (2)> direction. Furthermore, a first carrier mobility of the first current flow is equal to a second carrier mobility of the second current flow. Therefore, as discussed above, embodiments herein leverage the best hole and electron mobility advantages, wherein electron mobility is highest on a <001> wafer surface while hole mobility is highest on a <110> surface.

Figure 7:
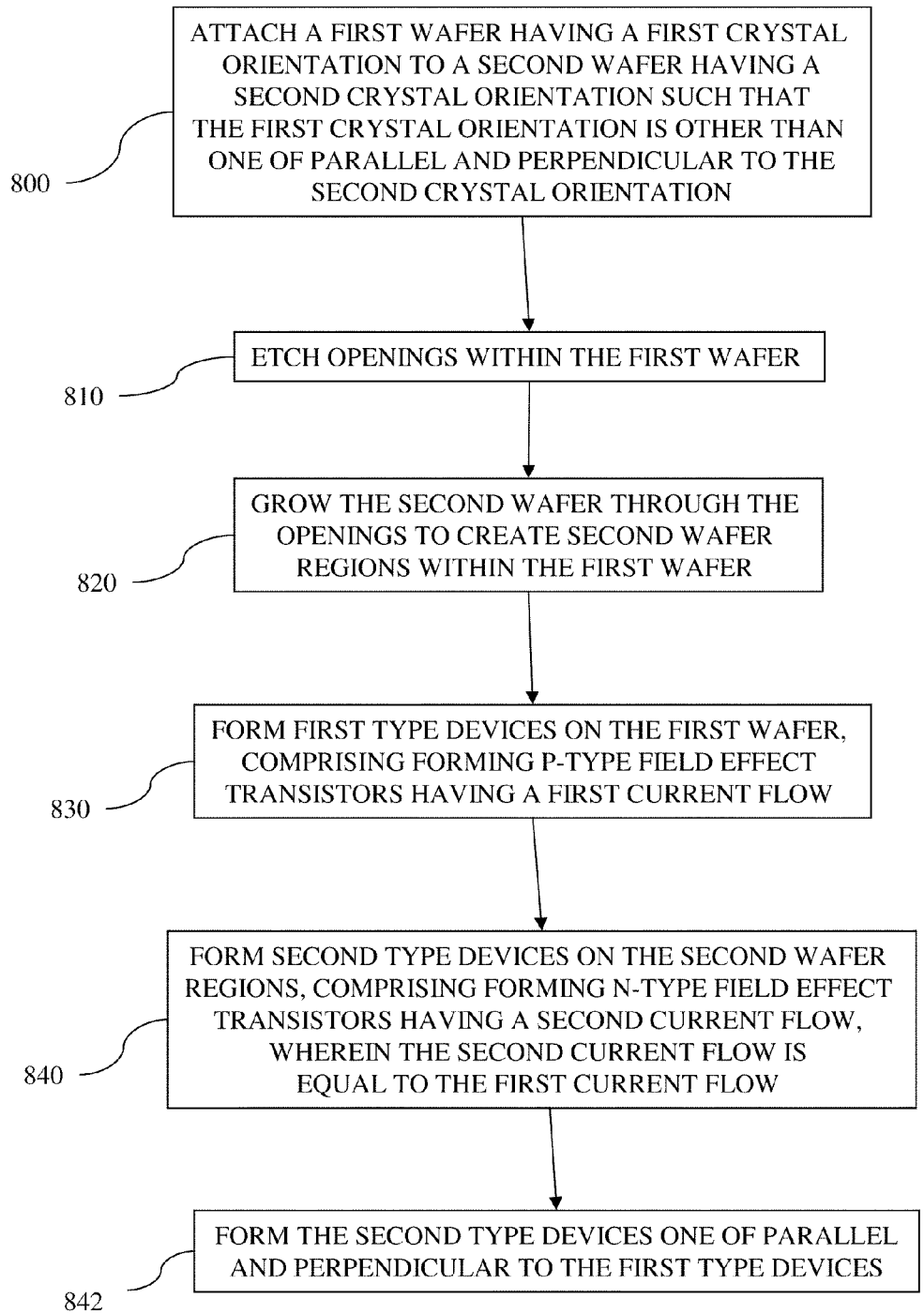
FIG. 7 is a flow diagram illustrating a method of the invention.

FIG. 7 illustrates a flow diagram of a method of forming an integrated circuit. In item 800, the method begins by attaching a first wafer having a first crystal orientation to a second wafer having a second crystal orientation such that the first crystal orientation is other than one of parallel and perpendicular to the second crystal orientation a first wafer having a first crystal orientation to a second wafer having a second crystal orientation such that the first crystal orientation is not parallel or perpendicular to the second crystal orientation. As discussed above, hydrogen is implanted into an oxidized silicon substrate with (110) crystalline orientation for type A or (100) crystalline orientation for type B. Then the wafer (i.e., the first wafer) is flip-bonded to a handle wafer (i.e., the second wafer) with different surface orientation.

Next, the method etches openings within the first wafer (item 810) and grows the second wafer through the openings to create second wafer regions within the first wafer (item 820). As discussed above, one additional lithography level is added to the standard CMOS processes, which is used to etch through the SOI and the buried-oxide layer and expose the surface of the handle wafer. The opened area should be for the NFETs 630 in the case of type A substrate or for the PFETs 620 for type B. Following a spacer formation, epitaxial silicon is selectively grown through the opening by rapid thermal chemical vapor deposition. As a nature of epitaxy, this epi-silicon will be in the same crystal orientation as the handle wafer. The growth rate of (110) silicon is slower than (100) silicon. A defective interface between the epitaxial silicon grown from the SOI layer and the handle wafer will occur in case of spacer loss, which can be eliminated by improved processes.

Following this, first type devices are formed on the first wafer (item 830) and second type devices are formed on the second wafer regions (item 840), wherein the second type devices are formed parallel or perpendicular to the first type devices (item 842). The forming of the first type devices and the forming of the second type devices comprise forming transistors, specifically the PFETs 620 and the NFETs 630. As discussed above, each of the PFETs 620 and each of the NFETs 630 comprise a source, a drain, a channel and a gate. The source and the drain are heavily doped regions in the substrate 600, wherein majority carriers flow into the channel through the source and out through the drain. The channel is a high conductivity region connecting the source and the drain, wherein conductivity of the channel is controlled by the gate.

Furthermore, during the step of attaching the first wafer, the first wafer is attached to the second wafer at an angle such that the first type devices comprise a first current flow and a second current flow, wherein the first current flow is orthogonal to the second current flow. For example, the current flow 621 is formed oriented in the <1-1 sqrt(2)> direction and the current flow 622 is formed oriented in the <−11 sqrt (2)> direction. Moreover, the first current flow is equal to the second current flow.

Accordingly, the two in-plane orthogonal directions have the same mobility. While there is no direct measurement of the mobility of the current flows, it is reasonable to suggest that the hole mobility value would lie between those of the <110> (100) and <110> (110) directions. Therefore, instead of the highly skewed 157% and 70% benefit for the two orthogonal directions of the prior art, embodiments herein get approximately 110% benefit in both directions. This gives a major structural opportunity to integrate orthogonally designed circuits. There is a major concern with the many process knobs that are needed to be optimized for integration. If the fall back is to go back to <001> surface devices for both NFET and PFET, then the ratio of the two orthogonal devices radically changes and circuit designs may fail.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the invention has been described in terms of preferred embodiments, those skilled in the art will recognize that the invention can be practiced with modification within the spirit and scope of the appended claims.

What is claimed is:

1. An integrated circuit comprising:
a hybrid orientation substrate, comprising first areas having a first crystalline orientation and second areas having a second crystalline orientation;
first type FET (Field Effect Transistor) devices on said first areas of said substrate, said first type FET devices having a channel length in a <1, −1, √2> direction; and
second type FET devices on said second areas of said substrate, said second type FET devices having a channel length in a <1, −1, √2> direction,
wherein said first type FET devices comprise a first current flow and a second current flow, wherein said first current flow is orthogonal to said second current flow, and wherein a majority carrier mobility of said first current flow is equal to a majority carrier mobility of said second current flow.

2. The integrated circuit according to claim 1, wherein said first type FET devices and said second type FET devices comprise transistors.

3. The integrated circuit according to claim 2, wherein said first type FET devices comprise p-type field effect transistors, and wherein said second type FET devices comprise n-type field effect transistors.

4. The integrated circuit according to claim 1, wherein said first crystalline orientation is other than one of parallel and perpendicular to said second crystalline orientation.

5. An integrated circuit comprising:
a hybrid orientation substrate, comprising first areas having a first crystalline orientation and second areas having a second crystalline orientation;
first type FET (Field Effect Transistor) devices on said first areas of said substrate, said first type FET devices having a channel length in a <1, −1, √2> direction; and
second type FET devices on said second areas of said substrate, said second type FET devices having a channel length in a <1, −1, √2> direction,
wherein said first crystalline orientation is other than one of parallel and perpendicular to said second crystalline orientation.

6. The integrated circuit according to claim 5, wherein said first type FET devices and said second type FET devices comprise transistors.

7. The integrated circuit according to claim 6, wherein said first type FET devices comprise p-type field effect transistors, and wherein said second type FET devices comprise n-type field effect transistors.

8. The integrated circuit according to claim 5, wherein said first type FET devices are one of parallel and perpendicular to said second type FET devices.

9. The integrated circuit according to claim 5, wherein an angle between said first crystalline orientation and said second crystalline orientation is such that said first type FET devices comprise a first current flow and a second current flow, wherein said first current flow is orthogonal to said second current flow.

10. The integrated circuit according to claim 5, wherein said first type FET devices comprise a first current flow and a second current flow, wherein a majority carrier mobility of said first current flow is equal to a majority carrier mobility of said second current flow.

11. A method of forming an integrated circuit, comprising:
attaching a first wafer having a first crystal orientation to a second wafer having a second crystal orientation such that said first crystal orientation is other than one of parallel and perpendicular to said second crystal orientation;
etching openings within said first wafer;
growing said second wafer through said openings to create second wafer regions within said first wafer;
forming first type FET (Field Effect Transistor) devices on said first wafer, said first type FET devices having a channel length in a <1, −1, √2> direction; and
forming second type FET devices on said second wafer regions, said second type FET devices having a channel length in a <1, −1, √2> direction.

12. The method according to claim 11, wherein said forming of said first type FET devices and said forming of said second type FET devices comprise forming transistors.

13. The method according to claim 11, wherein said forming of said first type FET devices and said forming of said second type FET devices comprises forming p-type field effect transistors and n-type field effect transistors.

14. The method according to claim 11, wherein said forming of said second type FET devices comprises forming said second type FET devices one of parallel and perpendicular to said first type FET devices.

15. The method according to claim 11, wherein said attaching of said first wafer comprises attaching said first wafer to said second wafer at an angle such that said first type FET devices comprise a first current flow and a second current flow, wherein said first current flow is orthogonal to said second current flow.

16. The method according to claim 11, wherein said forming of said first type FET devices comprises forming said first type FET devices with a first current flow and a second current flow, wherein a majority carrier mobility of said first current flow is equal to a majority carrier mobility of said second current flow.

17. A method of forming an integrated circuit, comprising:
attaching a first wafer having a first crystal orientation to a second wafer having a second crystal orientation such that said first crystal orientation is other than one of parallel and perpendicular to said second crystal orientation;
etching openings within said first wafer;
growing said second wafer through said openings to create second wafer regions within said first wafer;
forming first type FET (Field Effect Transistor) devices on said first wafer, said first type FET devices having a channel length in a $<1, -1, \sqrt{2}>$ direction; and
forming second type FET devices on said second wafer regions, said second type FET devices having a channel length in a $<1, -1, \sqrt{2}>$ direction,
wherein said attaching of said first wafer comprises attaching said first wafer to said second wafer at an angle such that said first type FET devices comprise a first current flow and a second current flow, wherein said first current flow is orthogonal to said second current flow.

18. The method according to claim 17, wherein said forming of said first type FET devices and said forming of said second type FET devices comprises forming p-type field effect transistors and n-type field effect transistors.

19. The method according to claim 17, wherein said forming of said second type FET devices comprises forming said second type FET devices one of parallel and perpendicular to said first type FET devices.

20. The method according to claim 17, wherein said forming of said first type FET devices comprises forming said first type FET devices with a first current flow and a second current flow, wherein a majority carrier mobility of said first current flow is equal to a majority carrier mobility of said second current flow.

* * * * *